(12) United States Patent
Renau

(10) Patent No.: US 6,635,880 B1
(45) Date of Patent: Oct. 21, 2003

(54) HIGH TRANSMISSION, LOW ENERGY BEAMLINE ARCHITECTURE FOR ION IMPLANTER

(75) Inventor: Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/412,265

(22) Filed: Oct. 5, 1999

(51) Int. Cl.[7] .............................................. H01J 37/317
(52) U.S. Cl. ............................ 250/396 ML; 250/492.2
(58) Field of Search ........................... 250/298, 492.21, 250/492.2, 396 ML

(56) References Cited

U.S. PATENT DOCUMENTS

| | | | |
|---|---|---|---|
| 4,276,477 A | 6/1981 | Enge | 250/398 |
| 4,283,631 A | 8/1981 | Turner | 250/492 B |
| 4,899,059 A | 2/1990 | Freytsis et al. | 250/492.2 |
| 4,922,106 A | 5/1990 | Berrian et al. | 250/492.2 |
| 5,126,575 A | 6/1992 | White | 250/492.2 |
| 5,132,544 A * | 7/1992 | Glavish | 250/492.2 |
| 5,350,926 A | 9/1994 | White et al. | 250/492.21 |
| 5,834,786 A * | 11/1998 | White et al. | 250/492.21 |

FOREIGN PATENT DOCUMENTS

GB    2 059 148 A    4/1981

* cited by examiner

*Primary Examiner*—John R. Lee
*Assistant Examiner*—Anthony Quash

(57) ABSTRACT

An ion beam apparatus includes an ion source, a first magnet assembly, a structure defining a resolving aperture and a second magnet assembly. The ion source has an elongated extraction aperture for generating a ribbon ion beam. The first magnet assembly provides first magnetic fields for deflecting the ribbon ion beam perpendicular to the long dimension of the ribbon ion beam cross section, wherein different ion species in the ribbon ion beam are separated. The resolving aperture selects an ion species from the separated ion beam. The second magnet assembly provides second magnetic fields for deflecting ions of the selected ion species in the ribbon ion beam parallel to the long dimension of the ribbon ion beam cross section to produce desired ion trajectories. The width of the ribbon ion beam increases through most of the beamline. As a result, low energy performance is enhanced.

19 Claims, 6 Drawing Sheets

HIGH TRANSMISSION, LOW ENERGY BEAMLINE ARCHITECTURE FOR ION IMPLANTER

FIELD OF THE INVENTION

This invention relates to methods and apparatus for ion implantation of a workpiece and, more particularly, to a beamline architecture which permits ion implantation of semiconductor wafers with low energy ions.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of the wafer. The energetic ions in the beam penetrate into the bulk of the semiconductor material and are embedded into the crystalline lattice of the semiconductor material to form a region of desired conductivity.

Ion implantation systems usually include an ion source for converting a gas or solid material into a well-defined ion beam. The ion beam is mass analyzed to eliminate undesired ion species, is accelerated to a desired energy, and is directed onto a target plane. The beam is distributed over the target area by beam scanning, by target movement or by a combination of beam scanning and target movement. Examples of prior art ion implanter are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al; and U.S. Pat. No. 4,922,106 issued May 1, 1990 to Berrian et al.

A well-known trend in the semiconductor industry is toward smaller, higher speed devices. In particular, both the lateral dimensions and the depths of features in semiconductor devices are decreasing. State of the art semiconductor devices require junction depths less than 1000 angstroms and may eventually require junction depths on the order of 200 angstroms or less.

The implanted depth of the dopant material is determined, at least in part, by the energy of the ions implanted into the semiconductor wafer. Shallow junctions are obtained with low implant energies. Ion implanters are typically designed for efficient operation at relatively high implant energies, for example, in the range of 50 KeV to 400 KeV, and may not function efficiently at the energies required for shallow junction implantation. At low implant energies, such as energies of 2 KeV and lower, the-current delivered to the wafer is much lower than desired, and in some cases may be near zero. As a result, extremely long implant times are required to achieve a specified dose, and throughput is adversely affected. Such reduction in throughput increases fabrication cost and is unacceptable to semiconductor device manufacturers.

An ion implanter configuration for producing a high current ribbon beam is disclosed in U.S. Pat. No. 5,350,926 issued Sep. 27, 1994 to White et al. An ion source generates an ion beam that diverges in a horizontal plane. An analyzing magnet deflects a desired species in the ion beam to a resolving slit and focuses the desired species in the ion beam on the resolving slit. A second magnet deflects the beam that passes through the resolving slit to produce parallel ion trajectories. The disclosed ion implanter has highly satisfactory performance under a variety of conditions. However at low energies, space charge effects cause the beam to expand, particularly in the high current density region where the beam is focused, and performance at low energies may be unsatisfactory. Another beamline architecture having similar deficiencies is disclosed in U.S. Pat. No. 5,126,575 issued Jun. 30, 1992 to White.

Accordingly, there is a need for improved beamline architectures for ion implanters, which are capable of delivering high ion beam currents at low energies.

SUMMARY OF THE INVENTION

According to a first aspect of the invention, an ion beam apparatus is provided. The ion beam apparatus comprises an ion source, a first magnet assembly, a structure defining a resolving aperture and a second magnet assembly. The ion source has an elongated extraction aperture for generating a ribbon ion beam. The first magnet assembly provides first magnetic fields for deflecting the ribbon ion beam perpendicular to the long dimension of the ribbon ion beam cross section, wherein different ion species in the ribbon ion beam are separated. The resolving aperture selects an ion species from the separated ion beam. The second magnet assembly provides second magnetic fields for deflecting ions of the selected ion species in the ribbon ion beam parallel to the long dimension of the ribbon ion beam cross section to produce desired ion trajectories of the selected ion species in the ribbon ion beam. Preferably, the desired ion trajectories are substantially parallel. The width of the ribbon ion beam increases through most of the beamline. As a result, low energy performance is enhanced.

The first magnet assembly preferably comprises a resolving magnet having first polepieces separated by a first gap through which the ribbon ion beam passes. The second magnet assembly preferably comprises an angle corrector magnet having second polepieces separated by a second gap through which ions of the selected ion species in the ribbon ion beam pass. In a preferred embodiment, the first magnetic fields produced by the first magnet assembly are substantially horizontal and the second magnetic fields produced by the second magnet assembly are substantially vertical. The first magnet assembly preferably deflects ions of the selected ion species in the ribbon ion beam by an angle in a range of about 20° to 90° and more preferably by an angle of about 60°. The second magnet assembly preferably deflects ions of the selected ion species in the ribbon ion beam by an angle in a range of about 20° to 90° and more preferably by an angle of about 70°.

In one embodiment, the structure defining the resolving aperture comprises a mask positioned between the first and second magnet assemblies. In another embodiment, the structure defining the resolving aperture comprises the second polepieces of the second magnet assembly, and an entrance to the second gap constitutes the resolving aperture.

According to another aspect of the invention, a method is provided for producing an ion beam. The method comprises the steps of generating a ribbon ion beam in an ion source having an elongated extraction aperture, deflecting the ribbon ion beam perpendicular to the long dimension of the ribbon ion beam cross section, wherein different ion species in the ribbon ion beam are separated, selecting an ion species from the separated ribbon ion beam, and deflecting ions of the selected ion species in the ribbon ion beam parallel to the long dimension of the ribbon ion beam to produce desired ion trajectories of the selected ion species in the ribbon ion beam.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
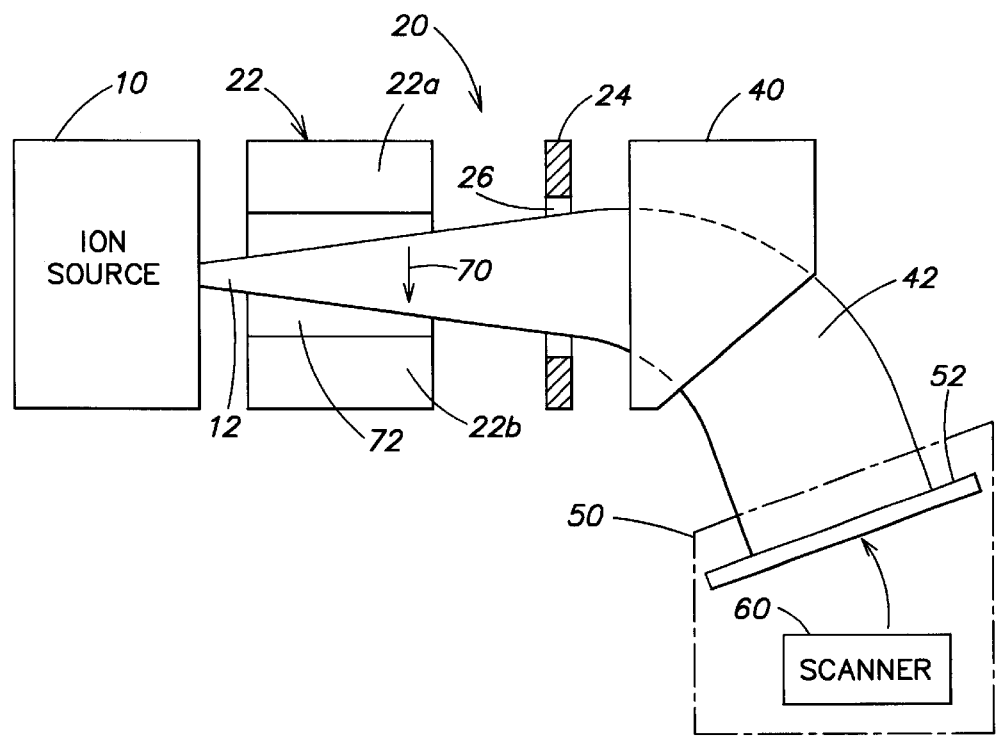
FIGS. 1 and 2 are top and side views, respectively, of an embodiment of an ion beam apparatus in accordance with the invention.
Figure 2:
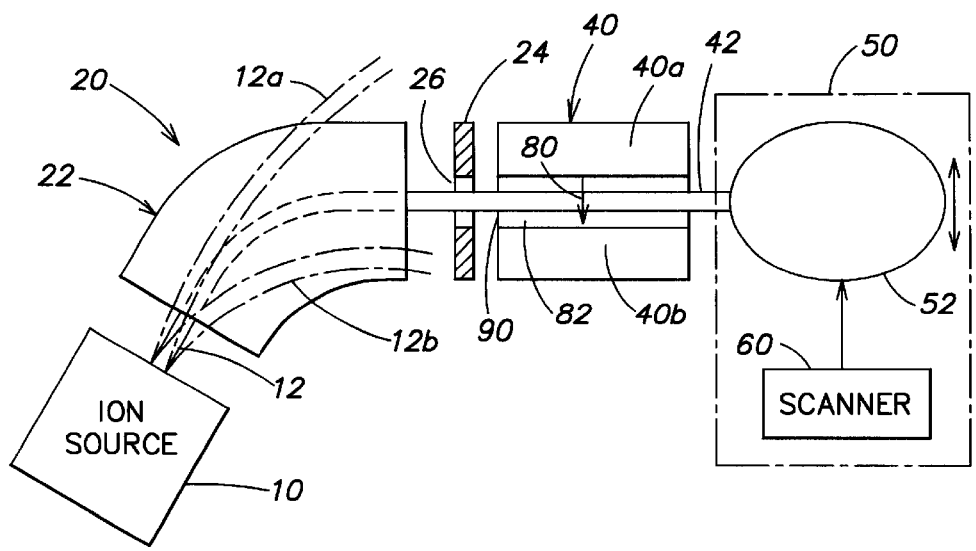

A simplified schematic block diagram of an embodiment of an ion beam apparatus in accordance with the invention is shown in FIGS. 1 and 2. FIG. 1 is a top view, and FIG. 2 is a side view. Like elements in the drawings have the same reference numerals. The ion beam apparatus of FIGS. 1 and 2 embodies a beamline architecture which may be used to implement an ion implanter.

An ion source 10 generates ions and supplies an ion beam 12. As described below, ion beam 12 has an elongated cross section and is ribbon-shaped, with a long dimension of the beam cross section having a horizontal orientation. In the embodiment of FIGS. 1 and 2, ion source 10 is oriented such that ion beam 12 exits from ion source 10 through an elongated exit aperture at an angle of approximately 60° with respect to horizontal. A mass analyzer 20, which may include a resolving magnet 22 and a mask 24 having a resolving aperture 26, selects a desired ion species from the particles generated by the ion source 10. Ions of the desired ion species pass through resolving aperture 26 to an angle corrector magnet 40. Angle corrector magnet 40 deflects ions of the desired ion species and converts the ion beam from a diverging ion beam to a ribbon ion beam 42 having substantially parallel ion trajectories.

An end station 50 supports one or more semiconductor wafers, such as wafer 52, in the path of ribbon ion beam 42 such that ions of the desired species are implanted into the semiconductor wafers. A scanner 60 moves wafer 52 perpendicular to the long dimension of ribbon ion beam 42 cross section so as to distribute ions over the surface of wafer 52.

The ion implanter may include additional components known to those skilled in the art. For example, end station 50 typically includes automated wafer handling equipment for introducing wafers into the ion implanter and for removing wafers after implantation. End station 50 may also include a dose measuring system, an electron flood gun and other known components. It will be understood that the entire path traversed by the ion beam is evacuated during ion implantation.

Resolving magnet 22 may be a dipole magnet which produces a magnetic field 70 in a gap 72 between polepieces 22a and 22b. In the embodiment of FIGS. 1 and 2, magnetic field 70 is horizontal. More particularly, magnetic field 70 is parallel to the long dimension of the cross section of ribbon ion beam 12 and is perpendicular to the direction of ion beam movement. As is known in the art, ions in the ion beam are deflected by the magnetic field in a direction perpendicular to the direction of ion beam movement and perpendicular to the direction of the magnetic field. Accordingly, ions in ion beam 12 are deflected by horizontal magnetic field 70 in vertical planes, perpendicular to the long dimension of the ribbon ion beam cross section.

In a dipole magnetic field an ion follows a path that is related to its ionic mass and to its energy in electron volts. Thus, ions having the same charge but different masses are deflected through different angles by resolving magnet 22. Ions of the desired mass and energy are deflected by resolving magnet 22 so as to pass through resolving aperture 26. In the embodiment of FIGS. 1 and 2, resolving magnet 22 deflects ions of the desired mass and energy through about 60°, so that ion beam 12 is substantially horizontal as it passes through resolving aperture 26. Ions other than the desired ion species, indicated in FIG. 2 by beams 12a and 12b, are deflected through different angles and are intercepted by mask 24 or other structures in the beamline. Resolving magnet 22 thus separates ion beam 12 according to the masses of the ions in the beam.

Resolving magnet 22 preferably has a resolving power in a range of about 30 to 40, but is not limited to this range. The resolving power is a measure of an analyzing magnet's ability to separate beams of different mass or, more correctly, momentum. The resolving power is usually defined as equal to M/DM for mass resolution or p/Dp for momentum resolving power. These refer to measurements of a spectrum that might be produced by, for example, a chart recorder, used to measure the variation in transmitted beam (the ordinate) with the mass being analyzed (the abscissa). DM is the full width half maximum width of the spectral peak, and M is it's mean mass. A similar definition applies to momentum resolution. In addition, resolving magnet 22 is positioned as close as is practical to the exit aperture of ion source 10. Gap 72 has sufficient width to pass ribbon ion beam 12. In one example, gap 72 is 100 millimeters (mm). The resolving magnet 22 may be designed to deflect ions of the desired species through an angle in a range of about 20° to 90°.

The resolving magnet 22 focuses the ion beam 12 vertically, so that the beam has a minimum height in or near angle corrector magnet 40. However, ion beam 12 is not focused in the horizontal direction and continues to expand through resolving magnet 22 and through at least a part of angle corrector magnet 40. Thus, the current density never increases sharply as in the case of a conventional mass analyzer which focuses the ion beam at the resolving aperture. Because the current density decreases through the beamline, space charge effects at low energies are limited, and uncontrolled beam expansion is avoided.

Angle corrector magnet 40 may be a dipole magnet wherein a magnetic field 80 is produced in a gap 82 between polepieces 40a and 40b. In the embodiment of FIGS. 1 and 2, magnetic field 80 in gap 82 is vertical. Since the direction of ion beam movement through gap 82 is horizontal, ion beam 12 is deflected in a horizontal plane perpendicular to magnetic field 80 and perpendicular to the direction of ion beam movement, as shown in FIG. 1. The ion beam is thus deflected parallel to the long dimension of the ribbon ion beam cross section. The polepieces 40a and 40b of angle corrector magnet 40 are designed to produce different deflections across the width of ribbon ion beam 12, so that the ions in ribbon ion beam 42 output by angle corrector magnet 40 have desired trajectories, which preferably are substantially parallel. Preferably, all ions in ribbon ion beam 42 are incident on the surface of wafer 52 at substantially the same angle. In the example of FIGS. 1 and 2, angle corrector magnet 40 produces a horizontal bend in ribbon ion beam 12 of approximately 70°. More generally, angle corrector magnet 40 may be designed to bend ribbon ion beam 12 through an angle in a range of about 20° to 900.

The design of angle corrector magnet 40 depends on the characteristics of the input ion beam and the desired trajectories of the output ion beam. The design of angle corrector magnets is well-known to those skilled in the art. For example, a 70° angle corrector magnet is utilized in the SHC 80 Ion Implanter, manufactured and sold by Varian Associates, Inc.

As described above, mask 24 having resolving aperture 26 may be used for selection of the desired ion species from the ion beam generated by ion source 10 and separated by resolving magnet 22. In another configuration, mask 24 is not utilized. Instead, an input aperture 90 of gap 82 in angle corrector magnet 40 serves as a resolving aperture. Undesired ion species are intercepted by polepieces 40a and 40b, or other structures in the beamline.

Figure 3:
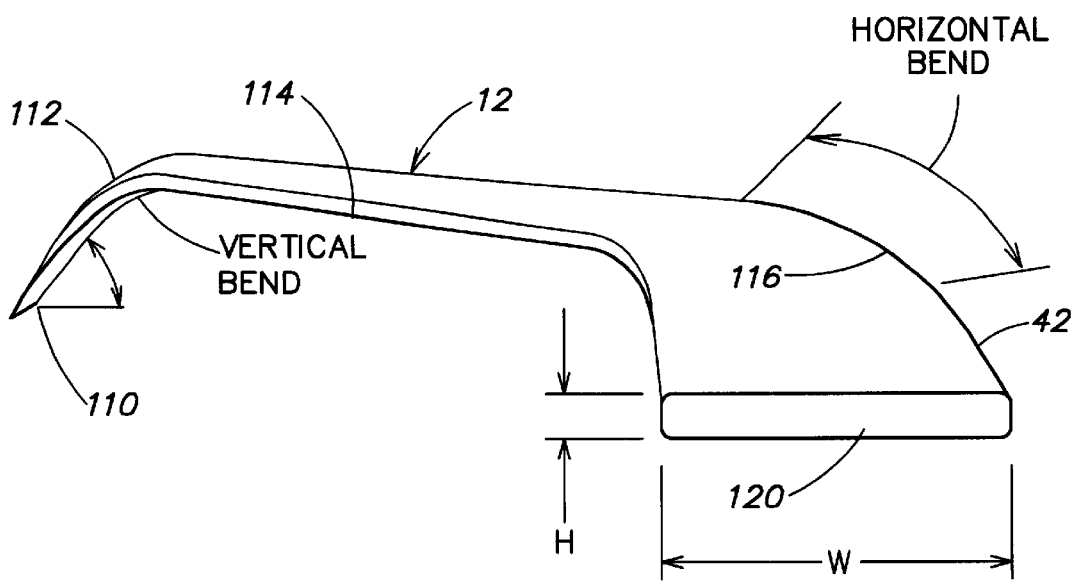
FIG. 3 is a representation of the ribbon ion beam in the ion beam apparatus of FIGS. 1 and 2.

A three-dimensional representation of ribbon ion beam 12 as it passes through the beamline architecture described above is shown in FIG. 3. Ribbon ion beam 12 exits from ion source 10, as indicated at 110, at an angle of 60° with respect to horizontal. The ribbon ion beam has an elongated cross-section with a long dimension that is horizontal. The resolving magnet 22 produces horizontal magnetic fields for deflecting the ribbon ion beam in vertical planes through a preferred angle of 60°, as indicated at 112. The ribbon ion beam that exits from resolving magnet 22 is substantially horizontal, as indicated at 114. The beam then passes through angle corrector magnet 40 and is bent in a horizontal plane, preferably by about 70°, as indicated at 116. Ribbon ion beam 42 output from angle corrector magnet 40 has substantially parallel ion trajectories.

The ribbon ion beam may increase in width from approximately 50 mm at the exit aperture of ion source 10 to greater than 300 mm where it is incident on wafer 52. The ribbon ion beam has a cross section 120 that is characterized by a width W, or long dimension, and a height H. In the above embodiment, the width W may be greater than 300 mm where the beam is incident on wafer 52. It will be understood that the ribbon ion beam may have different cross-sectional dimensions within the scope of the present invention. Furthermore, the vertical bend of desired ion species produced by resolving magnet 22 and the horizontal bend produced by angle corrector magnet 40 may vary within the scope of the present invention. Although the beamline architecture has been described with respect to resolving magnet 22 which produces horizontal magnetic fields and angle corrector magnet 40 which produces vertical magnetic fields, it will be understood that the beamline architecture described above may have any desired orientation in which the resolving magnet bends the beam in a first plane and the angle corrector magnet bends the beam in a second plane that is orthogonal to the first plane.

Figure 4:
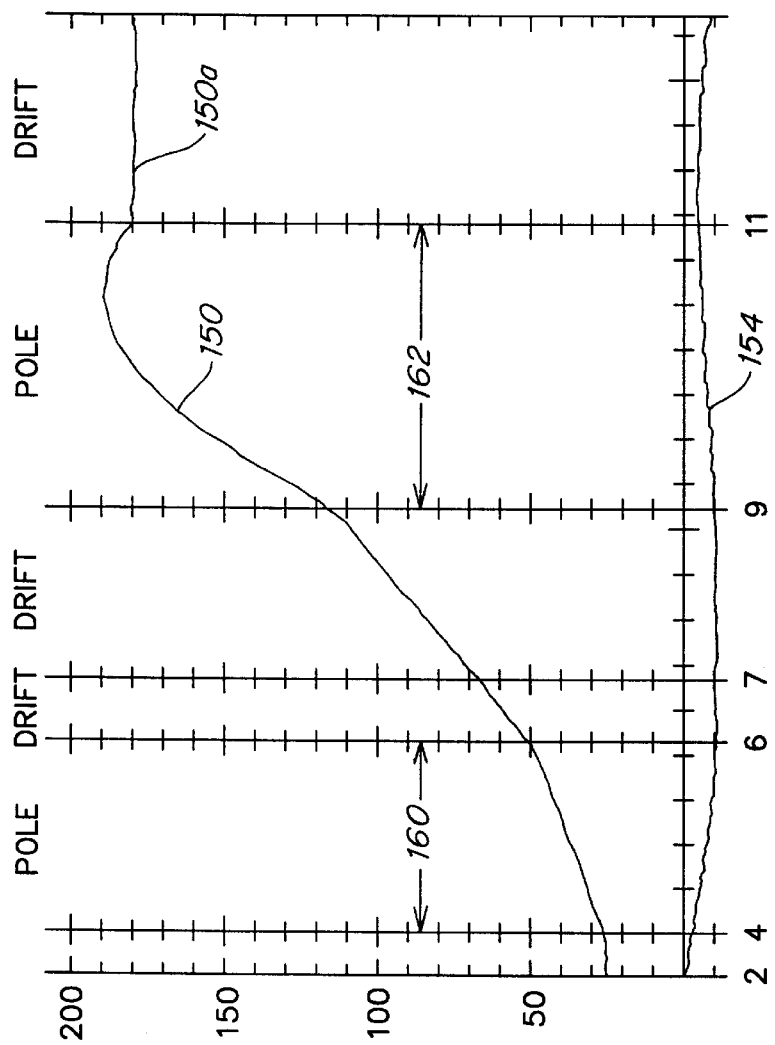
FIG. 4 is a graph of ribbon ion beam width and height as a function of distance from the ion source.

A graph of ribbon ion beam width and ribbon ion beam height as a function of distance from ion source 10 is shown in FIG. 4 for an example of the present invention. Curve 150 represents one half of the ribbon ion beam width in a horizontal direction as a function of distance from ion source 10. Curve 154 represents one half of the ribbon ion beam height as a function of distance from ion source 10. A region 160 of the graph corresponds to gap 72 of resolving magnet 22, and a region 162 of the graph corresponds to gap 82 of angle corrector magnet 40. It may be observed that the ion beam increases in width, as indicated by curve 150, from ion source 10 to a point before the output of angle corrector magnet 40. The beam remains constant in width between the output of angle corrector magnet 40 and wafer 52, as indicated by segment 150a of curve 150. The ribbon ion beam remains more or less constant in height, as indicated by curve 154 through the beamline, with a minimum height occurring near the output of angle corrector magnet 40.

Figure 5:
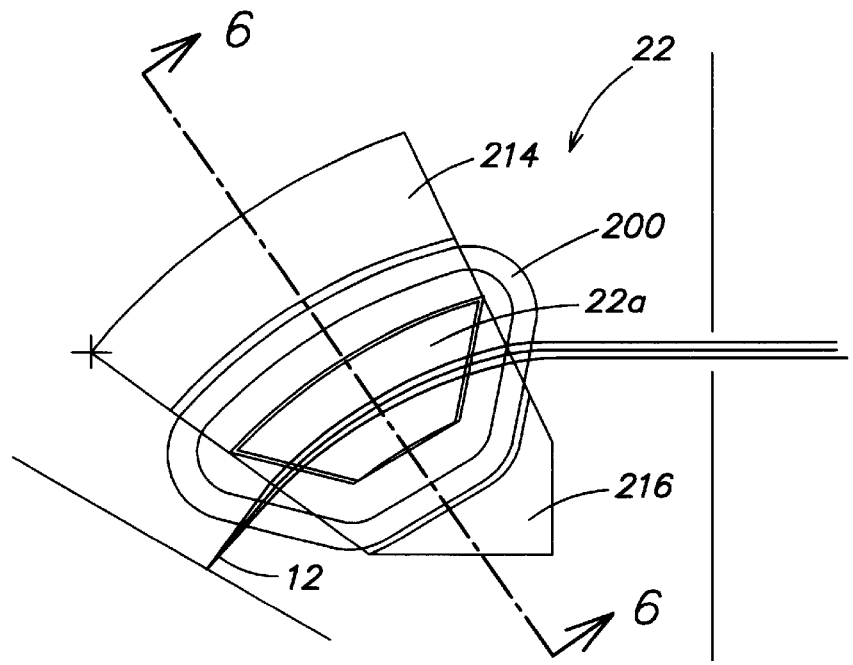
FIG. 5 is a cross-sectional elevation view of the resolving magnet shown in FIGS. 1 and 2.
Figure 6:
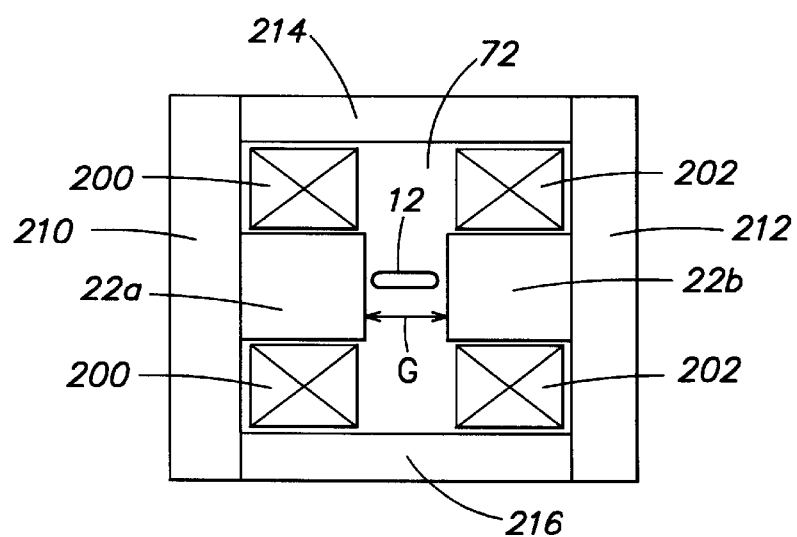
FIG. 6 is a cross-sectional view of the resolving magnet, taken along the line 6—6 of FIG. 5.

A cross-sectional elevation view of an embodiment of resolving magnet 22 is shown in FIG. 5. A cross section of the resolving magnet, taken along the line-6—6 of FIG. 5, is shown in FIG. 6. In resolving magnet 22, polepieces 22a and 22b are separated by gap 72 through which ribbon ion beam 12 passes. Analyzing magnet 22 further includes coils 200 and 202, and a return yoke including magnetic members 210, 212, 214 and 216. Current through coils 200 and 202 produces magnetic fields in polepieces 22a and 22b, and in gap 72. Magnetic members 210, 212, 214 and 216 interconnect polepieces 22a and 22b and provide return paths for the magnetic fields generated in gap 72.

In one design, resolving magnet 22 has as bend radius of 400 millimeters, a bend angle of 60°, a pole gap G of 100 millimeters and a pole width of 150 millimeters. The maximum magnetic field produced by the resolving magnet 22 is 0.885 Tesla. Coils 200 and 202 may each have 310 turns and a total coil resistance of 0.214 ohm. The magnet may be operated at a coil voltage of 26.8 volts and a maximum current of 125 amps.

Figure 7:
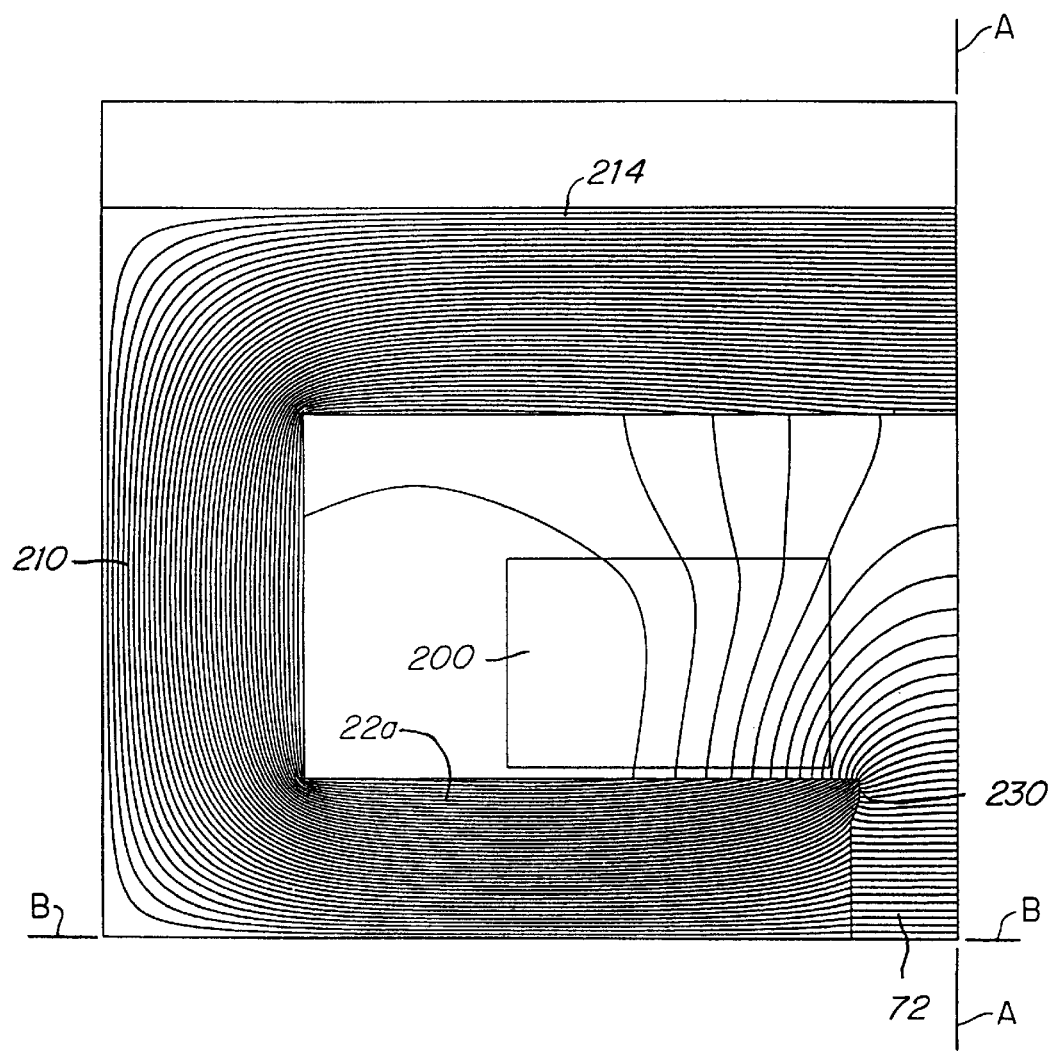
FIG. 7 is a representation of the magnetic fields produced by the resolving magnet of FIGS. 5 and 6.

A computer analysis of the magnetic fields produced by this design is shown in FIG. 7. One quarter of the analyzing magnet is shown, since the magnetic fields are symmetric about lines A—A and B—B shown in FIG. 7. It has been determined that a projection 230 on polepiece 22a produces more uniform magnetic fields in the region of gap 72 through which the ribbon ion beam passes. It will be understood that a symmetrical projection may be formed on the opposite edge of polepiece 22a and that similar projections may be formed on polepiece 22b. The above example provides better than 1% magnetic field uniformity in the region occupied by the ribbon ion beam. It will be understood that a variety of different resolving magnet configurations may be utilized within the scope of the present invention.

Figure 8:
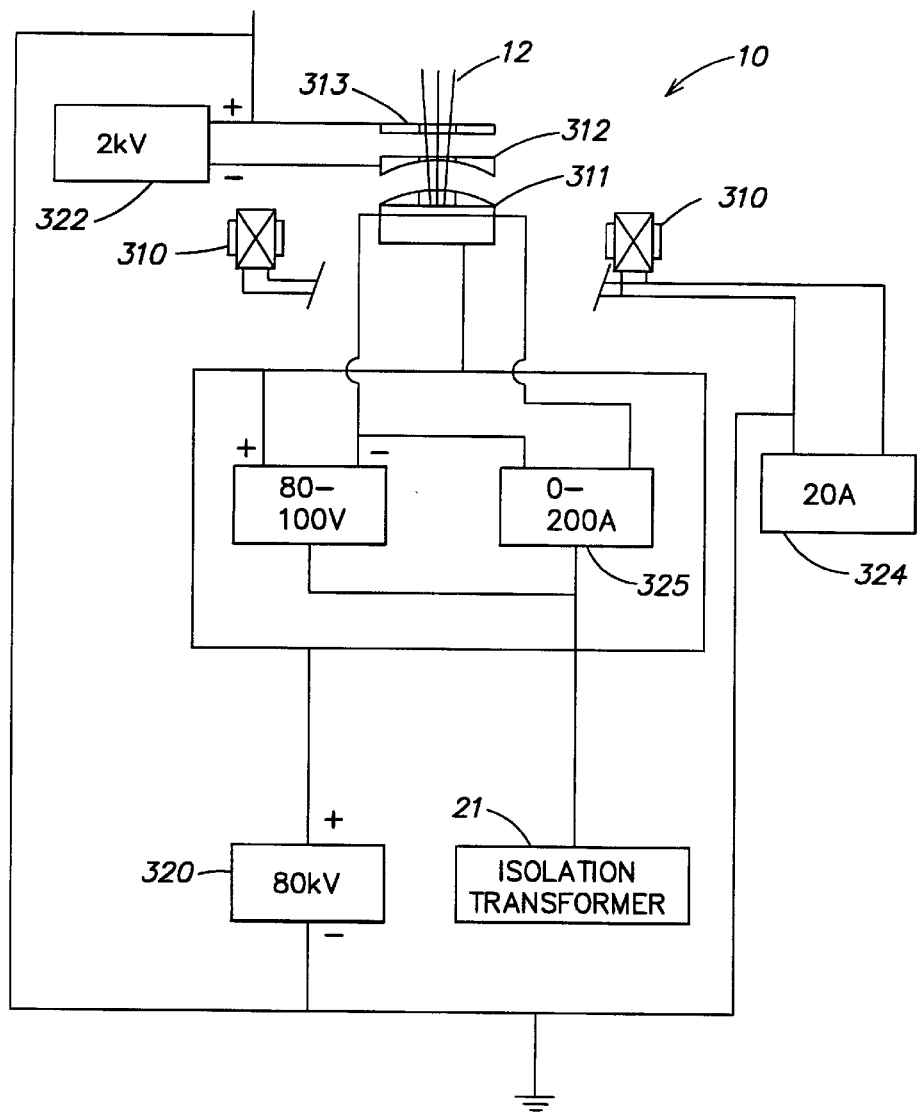
FIG. 8 is a schematic block diagram of an embodiment of the ion source shown in FIGS. 1 and 2.

A suitable ion source 10 and related components are shown in FIG. 8. Various ion sources may be utilized, including Freeman, Bernas, or microwave ion sources. A Freeman ion source is illustrated in FIG. 8. Ion beam 12 is ribbon shaped and may initially be between 50 and 75 millimeters wide and 2–5 millimeters high as it exits a curved slot in ion source 10.

The ion source 10 provides a spatially uniform distribution of ions across an elongated, slot-shaped aperture. Ion source 10 includes a power source 325 for passing current through a hot filament in a source chamber. A magnet 310 is energized by a magnet power supply 324 to constrain emitted electrons so that the gas molecules in the source chamber are efficiently and uniformly ionized. An arrangement of three slotted grids 311, 312 and 313 confines, extracts and accelerates ions from the source. A gas source (not shown) supplies gas of a desired species to the ion source chamber.

Extraction grid 311 may be bowed convexly outward such that the ions in the beam are initially accelerated normal to the surface along trajectories that diverge from a center of curvature located approximately 150 millimeters behind extraction grid 311 and diverge at an angle greater than ±5°. Grid 312 has a rear surface which is parallel to the contour of grid 11, so that emitted electrons are accelerated normal to the surface contour of grid 311. Grid 313, which is energized by a high voltage extraction source 320, is a flat plate parallel to the front surface of grid 312. A suppression power supply 322 is connected between grids 312 and 313 to maintain grid 312 at a higher potential difference with respect to the ion source so that the energy of the ion beam is decreased in passing from grid 312 to grid 313, and the beam is slightly collimated. Additional details regarding the ion source 10 are described in U.S. Pat. No. 5,350,926, which is hereby incorporated by reference.

Accordingly, resolving magnet 22 produces magnetic fields 70 that are parallel to the long dimension of the ribbon ion beam cross section and deflects the ribbon ion beam perpendicular to the long dimension of the ribbon ion beam cross section. Angle corrector magnet 40 produces magnetic fields that are perpendicular to the long dimension of the ribbon ion beam and deflects the ribbon ion beam parallel to the long dimension of the ribbon ion beam. Further, the magnetic fields produced by the resolving magnet and the angle corrector magnet are orthogonal to each other. The width of the ribbon ion beam increases through most of the beamline. As a result, beam expansion caused by space charge effects is limited, and low energy performance is enhanced.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Ion beam apparatus comprising:
   an ion source having an elongated extraction aperture for generating a ribbon ion beam said ribbon ion beam having a cross section with a long dimension;
   a first magnet assembly providing first magnetic fields parallel to the long dimension and perpendicular to the generated direction of said ribbon ion beam for deflecting said ribbon ion beam in vertical planes perpendicular to the long dimension of said ribbon ion beam cross section and focusing said ribbon ion beam vertically while expanding said ribbon ion beam in the horizontal direction, wherein different ion species in said ribbon ion beam are separated;
   a structure defining a resolving aperture through Which said ribbon beam passes substantially horizontal for selecting an ion species from the separated ribbon ion beam; and
   a second magnet assembly providing second magnetic fields perpendicular to the movement of said ribbon ion beam for deflecting ions of the selected ion species in said ribbon ion beam in a horizontal plane perpendicular to said second magnetic fields and perpendicular to the movement of said ribbon ion beam so that said ribbon ion beam is deflected parallel to the long dimension of said ribbon beam cross section to produce desired ion trajectories of the selected ion species in said ribbon ion beam.

2. Ion beam apparatus as defined in claim 1 wherein said first magnet assembly comprises a resolving magnet providing said first magnetic fields for deflection of ions of the selected ion species in said ribbon ion beam by angle of about 60°.

3. Ion beam apparatus as defined in claim 1 wherein said second magnet assembly comprises an angle corrector magnet providing said second magnetic fields for deflecting ions of the selected ion species in said ribbon ion beam by an angle of about 70°.

4. Ion beam apparatus as defined in claim 1 wherein the desired ion trajectories produced by said second magnet assembly are substantially parallel.

5. Ion beam apparatus as defined in claim 1 wherein said first magnet assembly comprises first polepieces separated by a first gap through which said ribbon ion beam passes.

6. Ion beam apparatus as defined in claim 1 wherein said first magnetic fields are substantially horizontal and said second magnetic fields are substantially vertical.

7. Ion beam apparatus as defined in claim 1 wherein the structure defining the resolving aperture comprises a mask positioned between said first and second magnet assemblies.

8. Ion beam apparatus as defined in claim 1 wherein said first magnet assembly deflects ions of the selected ion species in said ribbon ion beam by an angle in a range of about 20° to 90°.

9. Ion beam apparatus as defined in claim 1 wherein said second magnet assembly deflects ions of the selected ion species in said ribbon ion beam by an angle in a range of about 20° to 90°.

10. Ion beam apparatus as defined in claim 5 wherein said second magnet assembly comprises second polepieces separated by a second gap through which ions of the selected ion species in said ribbon ion beam pass.

11. Ion beam apparatus as defined in claim 10 wherein the structure defining the resolving aperture comprises the second polepieces of said second magnet assembly, and an entrance to said second gap constitutes said resolving aperture.

12. A method for producing an ion beam, comprising the steps of:
   (a) generating a ribbon ion beam in an ion-source having an elongated extraction aperture, said ribbon ion beam having a cross section with a long dimension;
   (b) providing first magnetic fields parallel to the long dimension and perpendicular to the generated direction of said ribbon ion beam for deflecting said ribbon ion beam in vertical planes perpendicular to the long dimension of said ribbon ion beam cross section and focusing said ribbon ion beam vertically while expanding said ribbon ion beam in a horizontal direction, wherein different ion species in said ribbon ion beam are separated;
   (c) selecting an ion species from the separated ribbon ion beam by passing said ribbon ion beam horizontally through a resolving aperture; and
   (d) providing second magnetic fields perpendicular to the movement of said ribbon ion beam for deflecting ions of the selected ion species in said ribbon ion beam in a horizontal plane perpendicular to said second magnetic fields and perpendicular to the movement of said ribbon ion beam so that said ribbon ion beam is deflected parallel to the long dimension of said ribbon ion beam cross section to produce desired ion trajectories of the selected ion species in said ribbon ion beam.

13. A method for producing an ion beam as defined in claim 12 wherein step (b) comprises deflecting ions of the selected ion species in said ribbon ion beam by an angle in a range of about 20° to 90° and wherein step (d) comprises deflecting ions of the selected ion species in said ribbon ion beam by an angle in a range of about 20° to 90°.

14. A method for producing an ion beam as defined in claim 12 wherein step (b) comprises deflecting ions of the selected ion species in said ribbon ion beam by about 60° and wherein step (d) comprises deflecting ions of the selected ion species in said ribbon ion beam by about 70°.

15. A method for producing an ion beam as defined in claim 12 wherein step (d) comprises deflecting ions of the selected ion species to produce substantially parallel ion trajectories.

16. A method for producing an ion beam as defined in claim 12 wherein step (b) comprises deflecting said ribbon ion beam with substantially horizontal first magnetic fields and wherein step (d) comprises deflecting ions of a selected ion species in said ribbon ion beam with substantially vertical second magnetic fields.

17. Ion beam apparatus comprising:

an ion source having an elongated extraction aperture for generating a ribbon ion beam, said ribbon ion beam having a cross section with a long dimension;

a resolving magnet assembly providing substantially horizontal magnetic fields parallel to the long dimension and perpendicular to the generated direction of said ribbon ion beam for deflecting said ribbon ion beam in vertical planes perpendicular to the long dimension of said ribbon ion beam cross section and focusing said ribbon ion beam vertically while expanding said ribbon ion beam in a horizontal direction so that different ion species in said ribbon ion beam are separated;

a structure defining a resolving aperture through which said ribbon ion beam passes substantially horizontal for selecting an ion species from the separated ribbon ions beam; and an angle corrector magnet assembly for providing substantially vertical magnetic fields perpendicular to the movement of said ribbon ion beam for deflecting ions of the selected ion species in said ribbon ion beam in a horizontal plane perpendicular to said vertical magnetic fields and perpendicular to the movement of said ribbon ion beam so that said ribbon ion beam is deflected parallel to the long dimension of said ribbon ion beam cross section to produce desired ion trajectories of the selected ion species in said ribbon ion beam.

18. Ion beam apparatus as defined in claim 17 wherein said resolving magnet assembly deflects ions of the selected ion species in said ribbon ion beam by about 60° and said angle corrector magnet assembly deflects ions of the selected ion species in said ribbon ion beam by about 70°.

19. Ion beam apparatus comprising:

an ion source having an elongated extraction aperture for generating a ribbon ion beam, said ribbon ion beam having a cross-section with a long dimension;

a first magnet assembly providing first magnetic fields oriented parallel to the long dimension of said ribbon ion beam and perpendicular to the generated direction of said ribbon ion beam for deflecting said ribbon ion beam in vertical planes perpendicular to the long dimension of said ribbon ion beam cross section and focusing said ribbon ion beam vertically while expanding said ribbon ion beam in a horizontal direction, wherein different ion species in said ribbon ion beam are separated;

a structure defining a resolving aperture through which said ribbon ion beam passes substantially horizontal for selecting an ion species from the separated ribbon ion beam; and a second magnet assembly providing second magnetic fields oriented perpendicular to the long dimension of said ribbon ion beam for deflecting ions of the selected ion species in said ribbon ion beam in a horizontal plane perpendicular to said second magnetic fields and perpendicular to the movement of said ribbon ion beam so that said ribbon ion beam is deflected parallel to the long dimension of said ribbon ion beam cross section to produce desired ion trajectories of the selected ion species in said ribbon ion beam.

* * * * *